United States Patent
Nishimoto et al.

(10) Patent No.: US 7,282,112 B2
(45) Date of Patent: *Oct. 16, 2007

(54) METHOD AND APPARATUS FOR AN IMPROVED BAFFLE PLATE IN A PLASMA PROCESSING SYSTEM

(75) Inventors: Shinya Nishimoto, Nirasaki (JP); Kouji Mitsuhashi, Nirasaki (JP); Hiroyuki Nakayama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/010,373

(22) Filed: Dec. 14, 2004

(65) Prior Publication Data
US 2005/0103268 A1    May 19, 2005

Related U.S. Application Data

(63) Continuation of application No. 10/259,382, filed on Sep. 30, 2002, now Pat. No. 6,837,966.

(51) Int. Cl.
    C23C 16/455   (2006.01)
    C23C 16/00    (2006.01)
    H01L 21/306   (2006.01)
    C23F 1/00     (2006.01)
(52) U.S. Cl. ............. 156/345.29; 118/715; 204/298.07
(58) Field of Classification Search ........ 118/715, 118/723 R, 723 MW, 723 ME, 723 AN, 118/723 E, 723 ER, 723 I, 723 IR; 156/345.29, 156/345.41, 345.43, 345.47–345.49, 345.51; 204/298.07
See application file for complete search history.

(56) References Cited

U.S. PATENT DOCUMENTS

| 4,310,390 | A |   | 1/1982  | Bradley et al. |
| 4,357,387 | A |   | 11/1982 | George et al. ............... 442/71 |
| 4,469,619 | A |   | 9/1984  | Ohno et al. |
| 4,593,007 | A |   | 6/1986  | Novinski |
| 4,612,077 | A |   | 9/1986  | Tracy et al. |
| 4,649,858 | A |   | 3/1987  | Sakai et al. ............... 118/697 |
| 4,842,683 | A | * | 6/1989  | Cheng et al. .......... 156/345.37 |
| 4,877,757 | A |   | 10/1989 | York et al. ............... 437/235 |
| 5,000,113 | A |   | 3/1991  | Wang et al. |
| 5,074,456 | A |   | 12/1991 | Degner et al. |

(Continued)

FOREIGN PATENT DOCUMENTS

DE    94 21 671    7/1996

(Continued)

OTHER PUBLICATIONS

JIS Using Series, "Spraying Techniques Manual.", p. 95 (Oct. 30, 1998, Japanese Standard Association), with English Translation.

(Continued)

*Primary Examiner*—Jeffrie R Lund
(74) *Attorney, Agent, or Firm*—Oblon, Spivak, McClelland, Maier & Neustadt, P.C.

(57) ABSTRACT

The present invention presents an improved baffle plate for a plasma processing system, wherein the design and fabrication of the baffle plate advantageously provides for a uniform processing plasma in the process space with substantially minimal erosion of the baffle plate.

21 Claims, 10 Drawing Sheets

U.S. PATENT DOCUMENTS

| | | | |
|---|---|---|---|
| 5,334,462 A | 8/1994 | Vine et al. | |
| 5,362,335 A | 11/1994 | Rungta | |
| 5,366,585 A | 11/1994 | Robertson et al. | |
| 5,367,838 A | 11/1994 | Visaisouk et al. | 451/39 |
| 5,423,936 A | 6/1995 | Tomita et al. | 156/345 |
| 5,426,310 A | 6/1995 | Tamada et al. | |
| 5,484,752 A | 1/1996 | Waku et al. | |
| 5,494,713 A | 2/1996 | Ootuki | |
| 5,521,790 A | 5/1996 | Ruckel et al. | 361/234 |
| 5,551,190 A | 9/1996 | Yamagishi et al. | |
| 5,556,501 A | 9/1996 | Collins et al. | |
| 5,614,055 A | 3/1997 | Fairbairn et al. | |
| 5,637,237 A | 6/1997 | Oehrlein et al. | 216/67 |
| 5,641,375 A | 6/1997 | Nitescu et al. | |
| 5,651,723 A | 7/1997 | Bjornard et al. | 451/39 |
| 5,680,013 A | 10/1997 | Dornfest et al. | |
| 5,725,960 A | 3/1998 | Konishi et al. | |
| 5,759,360 A | 6/1998 | Ngan et al. | |
| 5,798,016 A | 8/1998 | Oehrlein et al. | |
| 5,834,070 A | 11/1998 | Movchan et al. | 427/566 |
| 5,851,343 A | 12/1998 | Hsu et al. | |
| 5,868,848 A | 2/1999 | Tsukamoto | |
| 5,879,575 A | 3/1999 | Tepman et al. | |
| 5,885,356 A | 3/1999 | Zhao et al. | 156/345 |
| 5,885,402 A | 3/1999 | Esquibel | 156/345.24 |
| 5,891,253 A | 4/1999 | Wong et al. | 118/726 |
| 5,892,278 A | 4/1999 | Horita | 257/706 |
| 5,894,887 A | 4/1999 | Kelsey et al. | |
| 5,895,586 A | 4/1999 | Kaji et al. | |
| 5,900,064 A | 5/1999 | Kholodenko | |
| 5,902,763 A | 5/1999 | Waku et al. | 501/127 |
| 5,911,852 A | 6/1999 | Katayama et al. | |
| 5,919,332 A | 7/1999 | Koshiishi et al. | |
| 5,925,228 A | 7/1999 | Panitz | 204/484 |
| 5,944,902 A | 8/1999 | Redeker et al. | |
| 5,948,521 A | 9/1999 | Dlugosch et al. | 428/307.3 |
| 5,952,054 A | 9/1999 | Sato et al. | 427/449 |
| 5,952,060 A | 9/1999 | Ravi | |
| 5,955,182 A | 9/1999 | Yasuda et al. | |
| 5,968,377 A | 10/1999 | Yuasa et al. | 219/121.41 |
| 5,985,102 A | 11/1999 | Leiphart | |
| 5,994,662 A | 11/1999 | Murugesh | |
| 6,068,729 A | 5/2000 | Shrotriya | 156/345.26 |
| 6,073,449 A | 6/2000 | Watanabe et al. | 62/32 |
| 6,096,161 A | 8/2000 | Kim et al. | |
| 6,106,625 A | 8/2000 | Koai et al. | |
| 6,110,287 A | 8/2000 | Arai et al. | |
| 6,120,640 A | 9/2000 | Shih et al. | |
| 6,120,955 A | 9/2000 | Tokutake et al. | 430/65 |
| 6,123,791 A | 9/2000 | Han et al. | |
| 6,123,804 A | 9/2000 | Babassi et al. | |
| 6,129,808 A | 10/2000 | Wicker et al. | |
| 6,139,983 A | 10/2000 | Ohashi et al. | |
| 6,143,646 A | 11/2000 | Wetzel | |
| 6,170,429 B1 | 1/2001 | Schoepp et al. | |
| 6,176,969 B1 | 1/2001 | Park et al. | |
| 6,182,603 B1 | 2/2001 | Shang et al. | |
| 6,210,486 B1 | 4/2001 | Mizukami et al. | |
| 6,221,202 B1 | 4/2001 | Walko, II | |
| 6,246,479 B1 | 6/2001 | Jung et al. | |
| 6,264,788 B1 | 7/2001 | Tomoyasu et al. | |
| 6,265,757 B1 | 7/2001 | Brady et al. | |
| 6,266,133 B1 | 7/2001 | Miyajima et al. | 355/72 |
| 6,296,740 B1 | 10/2001 | Xie et al. | 204/192.11 |
| 6,335,293 B1 | 1/2002 | Luo et al. | |
| 6,364,949 B1 | 4/2002 | Or et al. | |
| 6,368,987 B1 | 4/2002 | Kopacz et al. | |
| 6,373,573 B1 | 4/2002 | Jung et al. | |
| 6,383,333 B1 | 5/2002 | Haino et al. | |
| 6,383,964 B1 | 5/2002 | Nakahara et al. | |
| 6,394,026 B1 | 5/2002 | Wicker et al. | |
| 6,413,578 B1 | 7/2002 | Stowell et al. | 427/142 |
| 6,444,083 B1 | 9/2002 | Steger et al. | |
| 6,514,377 B1 | 2/2003 | Morimoto | |
| 6,519,037 B2 | 2/2003 | Jung et al. | |
| 6,527,911 B1 | 3/2003 | Yen et al. | |
| 6,533,910 B2 | 3/2003 | O'Donnell et al. | |
| 6,537,429 B2 | 3/2003 | O'Donnell et al. | |
| 6,544,380 B2 | 4/2003 | Tomoyasu et al. | |
| 6,554,906 B1 | 4/2003 | Kuibira et al. | 118/725 |
| 6,562,186 B1 | 5/2003 | Saito et al. | 156/345.24 |
| 6,570,654 B2 | 5/2003 | Jung et al. | |
| 6,583,064 B2 | 6/2003 | Wicker et al. | |
| 6,590,660 B2 | 7/2003 | Jung et al. | |
| 6,613,204 B2 | 9/2003 | Xie et al. | 204/298.04 |
| 6,613,442 B2 | 9/2003 | O'Donnell et al. | 428/469 |
| 6,641,697 B2 | 11/2003 | Han et al. | |
| 6,663,714 B2 * | 12/2003 | Mizuno et al. | 118/719 |
| 6,695,929 B2 | 2/2004 | Kanekiyo et al. | |
| 6,726,801 B2 * | 4/2004 | Ahn | 156/345.29 |
| 6,733,620 B1 | 5/2004 | Sugiyama et al. | |
| 6,738,862 B1 | 5/2004 | Ross et al. | |
| 6,776,873 B1 | 8/2004 | Sun et al. | 156/345.41 |
| 6,783,863 B2 | 8/2004 | Harada et al. | |
| 6,783,875 B2 | 8/2004 | Yamada et al. | 428/697 |
| 6,798,519 B2 | 9/2004 | Nishimoto et al. | |
| 6,805,952 B2 | 10/2004 | Chang et al. | 428/334 |
| 6,806,949 B2 | 10/2004 | Ludviksson et al. | 356/27 |
| 6,811,651 B2 | 11/2004 | Long | 156/345.27 |
| 6,830,622 B2 | 12/2004 | O'Donnell et al. | |
| 6,833,279 B2 | 12/2004 | Choi | 438/4 |
| 6,837,966 B2 | 1/2005 | Nishimoto et al. | |
| 6,852,433 B2 | 2/2005 | Maeda | 428/697 |
| 6,863,594 B2 | 3/2005 | Preising | 451/39 |
| 6,875,477 B2 | 4/2005 | Trickett et al. | 427/454 |
| 6,884,516 B2 | 4/2005 | Harada et al. | |
| 6,894,769 B2 | 5/2005 | Ludviksson et al. | 356/72 |
| 6,896,785 B2 | 5/2005 | Shatrov et al. | 205/109 |
| 2001/0003271 A1 | 6/2001 | Otsuki | |
| 2001/0050144 A1 | 12/2001 | Nishikawa et al. | 156/345 |
| 2002/0076508 A1 | 6/2002 | Chiang et al. | |
| 2002/0086118 A1 | 7/2002 | Chang et al. | |
| 2002/0086501 A1 | 7/2002 | O'Donnell et al. | |
| 2002/0086545 A1 | 7/2002 | O'Donnell et al. | |
| 2002/0086553 A1 | 7/2002 | O'Donnell et al. | |
| 2002/0090464 A1 | 7/2002 | Jiang et al. | |
| 2002/0142611 A1 | 10/2002 | O'Donnell et al. | |
| 2002/0177001 A1 | 11/2002 | Harada et al. | 428/469 |
| 2003/0010446 A1 | 1/2003 | Kajiyama et al. | |
| 2003/0029563 A1 | 2/2003 | Kaushal et al. | |
| 2003/0084848 A1 | 5/2003 | Long | |
| 2003/0113479 A1 | 6/2003 | Fakuda et al. | 427/569 |
| 2003/0150419 A1 | 8/2003 | Daragheh et al. | 123/193.6 |
| 2003/0200929 A1 | 10/2003 | Otsuki | |
| 2004/0026372 A1 | 2/2004 | Takenaka et al. | |
| 2004/0035364 A1 | 2/2004 | Tomoyoshi et al. | |
| 2004/0050495 A1 | 3/2004 | Sumiya et al. | 156/345.48 |
| 2004/0060516 A1 | 4/2004 | Nishimoto et al. | |
| 2004/0060656 A1 | 4/2004 | Saigusa et al. | |
| 2004/0060657 A1 | 4/2004 | Saigusa et al. | |
| 2004/0060658 A1 | 4/2004 | Nishimoto et al. | |
| 2004/0060661 A1 | 4/2004 | Nishimoto et al. | |
| 2004/0060779 A1 | 4/2004 | Kreger | 188/71.5 |
| 2004/0061447 A1 | 4/2004 | Saigusa et al. | |
| 2004/0063333 A1 | 4/2004 | Saigusa et al. | |
| 2004/0072426 A1 | 4/2004 | Jung | |
| 2004/0081746 A1 | 4/2004 | Imafuku | |
| 2004/0083970 A1 | 5/2004 | Imafuku et al. | 118/719 |
| 2004/0125359 A1 | 7/2004 | Ludviksson et al. | |
| 2004/0168640 A1 | 9/2004 | Muto et al. | 118/728 |
| 2004/0173155 A1 | 9/2004 | Nishimoto et al. | |
| 2005/0103268 A1 | 5/2005 | Nishimoto et al. | |
| 2005/0103275 A1 | 5/2005 | Sasaki et al. | |
| 2005/0150866 A1 | 7/2005 | O'Donnell | 216/67 |

| | | |
|---|---|---|
| 2006/0134919 A1 | 6/2006 | Hamelin et al. ............ 438/706 |

FOREIGN PATENT DOCUMENTS

| | | |
|---|---|---|
| EP | 0 508 731 | 10/1992 |
| EP | 0 573 057 | 12/1993 |
| EP | 0 799 904 | 10/1997 |
| EP | 0 814 495 | 12/1997 |
| EP | 0 841 838 | 5/1998 |
| EP | 1 069 603 | 1/2001 |
| EP | 1 081 749 | 3/2001 |
| EP | 1 156 130 | 11/2001 |
| GB | 2 252 567 | 8/1992 |
| JP | 61-207566 | 9/1986 |
| JP | 64-039728 | 2/1989 |
| JP | 01-312087 | 12/1989 |
| JP | 1-312087 | 12/1989 |
| JP | 02-267967 | 11/1990 |
| JP | 03-115535 | 5/1991 |
| JP | 04-238882 | 8/1992 |
| JP | H4-238882 | 8/1992 |
| JP | 05-070922 | 3/1993 |
| JP | 05-117064 | 5/1993 |
| JP | 05-121360 | 5/1993 |
| JP | 05-198532 | 8/1993 |
| JP | 05-238859 | 9/1993 |
| JP | 06-057396 | 3/1994 |
| JP | 06-136505 | 5/1994 |
| JP | 06-142822 | 5/1994 |
| JP | 06-256926 | 9/1994 |
| JP | 07-058013 A | 3/1995 |
| JP | 07-126827 | 5/1995 |
| JP | 07-176524 | 7/1995 |
| JP | 07-226378 | 8/1995 |
| JP | 07-245295 | 9/1995 |
| JP | 08-037180 | 2/1996 |
| JP | 08-041309 | 2/1996 |
| JP | 08-081777 | 3/1996 |
| JP | 08-268751 | 10/1996 |
| JP | 08-339895 | 12/1996 |
| JP | 09-069554 | 3/1997 |
| JP | 09-272987 | 10/1997 |
| JP | 10-004083 | 1/1998 |
| JP | 10-045461 | 2/1998 |
| JP | 10-045467 | 2/1998 |
| JP | 10-130884 | 5/1998 |
| JP | 10-214819 | 8/1998 |
| JP | 10-251871 | 9/1998 |
| JP | 11-080925 | 3/1999 |
| JP | 11-207161 | 8/1999 |
| JP | 11-233292 | 8/1999 |
| JP | 11-312646 | 11/1999 |
| JP | 2000-124197 | 4/2000 |
| JP | 2000-303180 | 10/2000 |
| JP | 2001-031484 | 2/2001 |
| JP | 2001-152307 | 6/2001 |
| JP | 2001-164354 | 6/2001 |
| JP | 2001-226773 | 8/2001 |
| JP | 2002-151473 | 5/2002 |
| KR | 1998-063542 | 10/1998 |
| KR | 1999-008142 | 1/1999 |
| KR | 2002-0027373 | 4/2002 |
| KR | 10/2004-0007601 | 1/2004 |
| WO | WO99/50886 | 10/1999 |
| WO | 01/42526 | 6/2001 |
| WO | WO 01/42526 | 6/2001 |
| WO | 02/39495 | 5/2002 |
| WO | 02/48421 | 6/2002 |
| WO | WO 02/48421 | 6/2002 |
| WO | WO 2004/030011 | 4/2004 |
| WO | WO 2004/030012 | 4/2004 |
| WO | WO 2004/030013 | 4/2004 |
| WO | WO 2004/030014 | 4/2004 |
| WO | WO 2004/030015 | 4/2004 |
| WO | WO 2004/030020 | 4/2004 |
| WO | WO 2004/030426 | 4/2004 |
| WO | WO 2004/095530 | 11/2004 |
| WO | WO 2004/095532 | 11/2004 |

OTHER PUBLICATIONS

Production drawing for Deposition Shield, Upper believed to be sold in the U.S. on Apr. 12, 2000.

Production drawing for Deposition Shield believed to be sold in the U.S. prior to Sep. 30, 2001.

Production drawing for Upper Electrode believed to be sold in the U.S. prior to Sep. 30, 2001.

Kim, Hee Jee, "Plasma-Sprayed Alumina-Yttria Ceramic Coatings for Cavitation-Erosion Protection," Sep. 1989, pp. 139-146.

* cited by examiner

METHOD AND APPARATUS FOR AN IMPROVED BAFFLE PLATE IN A PLASMA PROCESSING SYSTEM

CROSS-REFERENCE TO RELATED APPLICATIONS

This application is a continuation of U.S. patent application Ser. No. 10/259,382 filed Sep. 30, 2002 now U.S. Pat. No 6,837,966. The entire contents of this application are incorporated herein by reference. This application is related to co-pending U.S. patent application Ser. No. 10/259,858, entitled "Method and apparatus for an improved upper electrode plate with deposition shield in a plasma processing system", filed on Sep. 30, 2002; co-pending U.S. patent application Ser. No. 10/259,757, entitled "Method and apparatus for an improved upper electrode plate in a plasma processing system", filed on Sep. 30, 2002; co-pending U.S. patent application Ser. No. 10/259,380, entitled "Method and apparatus for an improved baffle plate in a plasma processing system", filed on Sep. 30, 2002; co-pending U.S. patent application Ser. No. 10/259,353, entitled "Method and apparatus for an improved deposition shield in a plasma processing system", filed on Sep. 30, 2002; co-pending U.S. patent application Ser. No. 10/259,352, entitled "Method and apparatus for an improved optical window deposition shield in a plasma processing system", filed on Sep. 30, 2002; and co-pending U.S. patent application Ser. No. 10/259,306, entitled "Method and apparatus for an improved bellows shield in a plasma processing system", filed on Sep. 30, 2002. The entire contents of all of those applications are herein incorporated by reference in their entirety.

FIELD OF THE INVENTION

The present invention relates to an improved component for a plasma processing system and, more particularly, to a baffle plate employed in a plasma processing system surrounding a substrate holder.

BACKGROUND OF THE INVENTION

The fabrication of integrated circuits (IC) in the semiconductor industry typically employs plasma to create and assist surface chemistry within a plasma reactor necessary to remove material from and deposit material to a substrate. In general, plasma is formed within the plasma reactor under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

Although the formation of a population of charged species (ions, etc.) and chemically reactive species is necessary for performing the function of the plasma processing system (i.e. material etch, material deposition, etc.) at the substrate surface, other component surfaces on the interior of the processing chamber are exposed to the physically and chemically active plasma and, in time, can erode. The erosion of exposed components in the plasma processing system can lead to a gradual degradation of the plasma processing performance and ultimately to complete failure of the system.

In order to minimize the damage sustained by exposure to the processing plasma, components of the plasma processing system, known to sustain exposure to the processing plasma, are coated with a protective barrier. For example, components fabricated from aluminum can be anodized to produce a surface layer of aluminum oxide, which is more resistant to the plasma. In another example, a consumable or replaceable component, such as one fabricated from silicon, quartz, alumina, carbon, or silicon carbide, can be inserted within the processing chamber to protect the surfaces of more valuable components that would impose greater costs during frequent replacement. Furthermore, it is desirable to select surface materials that minimize the introduction of unwanted contaminants, impurities, etc. to the processing plasma and possibly to the devices formed on the substrate.

In both cases, the inevitable failure of the protective coating, either due to the integrity of the protective barrier or the integrity of the fabrication of the protective barrier, and the consumable nature of the replaceable components demands frequent maintenance of the plasma processing system. This frequent maintenance can produce costs associated with plasma processing down-time and new plasma processing chamber components, which can be excessive.

SUMMARY OF THE INVENTION

The present invention provides an improved baffle plate for a plasma processing system, wherein the design and fabrication of the baffle plate advantageously addresses the above-identified shortcomings.

It is an object of the present invention to provide a baffle plate comprising a ring having an upper surface, a lower surface, an inner radial edge, and an outer radial edge. The upper surface can further comprise a first mating surface proximate the outer radial edge. The lower surface can further comprise a second mating surface proximate the outer radial edge and a plurality of fastener mating surfaces proximate the inner radial edge. The baffle plate can further comprise at least one passageway coupled to the upper surface and to the lower surface, and configured to permit the flow of gas therethrough, wherein the at least one passageway can comprise an inner passageway surface.

It is an object of the present invention to further provide a baffle plate comprising a plurality of fastening receptors, each fastening receptor coupled to the upper surface and the lower surface, and configured to receive fastening devices to couple the baffle plate to the plasma processing system. Each fastening receptor can comprise an entrant cavity, an exit through-hole, and an inner receptor surface.

It is an object of the present invention to further provide a baffle plate comprising a plurality of mounting through-holes, each mounting through-hole coupled to the upper surface and the lower surface, and configured to receive fastening devices to couple the baffle plate to the plasma processing system.

It is an object of the present invention that the baffle plate further comprises a protective barrier formed on exposed surfaces of the baffle plate facing the processing plasma.

It is a further object of the present invention that the exposed surfaces of the baffle plate comprise the upper surface of the baffle plate excluding the first mating surface; the lower surface of the baffle plate excluding the plurality of fastener mating surfaces and the second mating surface; and the inner passageway surface contiguous with the upper surface and the lower surface. The present invention optionally can include also identifying the first entrant surface of each of the plurality of fastening receptors and the first lip surface of each of the plurality of fastening receptors as exposed surfaces.

The present invention further provides a method of producing the baffle plate in the plasma processing system comprising the steps: fabricating the baffle plate; anodizing the baffle plate to form a surface anodization layer on the baffle plate; machining exposed surfaces on the baffle plate to remove the surface anodization layer; and forming a protective barrier on the exposed surfaces.

The present invention provides another method of producing the baffle plate in the plasma processing system comprising the steps: fabricating the baffle plate; masking exposed surfaces on the baffle plate to prevent formation of a surface anodization layer; anodizing the baffle plate to form the surface anodization layer on the baffle plate; unmasking the exposed surfaces; and forming a protective barrier on the exposed surfaces.

The present invention provides another method of producing the baffle plate in the plasma processing system comprising the steps: fabricating the baffle plate; and forming a protective barrier on a plurality of exposed surfaces.

The present invention may also include a process of combining machining and masking to prepare the exposed surfaces to receive the protective barrier, and then forming the protective barrier on the exposed surfaces. For example, two of the exposed surfaces can be masked prior to anodizing, and two of the surfaces can be machined after anodizing to create four exposed surfaces on which the protective barrier can be formed.

Any of the above methods may also optionally include machining anodized (or otherwise coated) surfaces that are not exposed surfaces (e.g., to obtain a bare metal connection where the machined surface will mate with another part).

BRIEF DESCRIPTION OF THE DRAWINGS

These and other advantages of the invention will become more apparent and more readily appreciated from the following detailed description of the exemplary embodiments of the invention taken in conjunction with the accompanying drawings, where.

DETAILED DESCRIPTION OF AN EMBODIMENT

Figure 1:
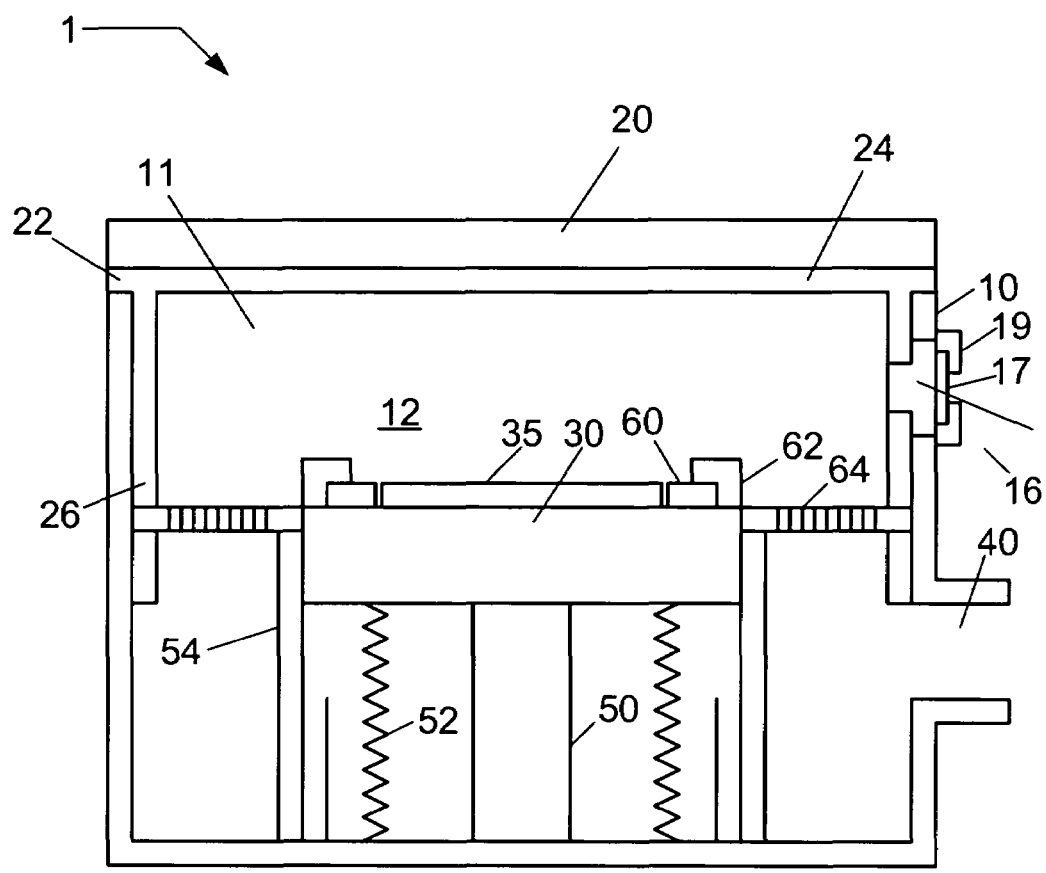
FIG. 1 shows a simplified block diagram of a plasma processing system comprising a baffle plate according to an embodiment of the present invention.

According to an embodiment of the present invention, a plasma processing system 1 is depicted in FIG. 1 comprising a plasma processing chamber 10, an upper assembly 20, an upper electrode 22, a substrate holder 30 for supporting a substrate 35, and a pumping duct 40 coupled to a vacuum pump (not shown) for providing a reduced pressure atmosphere 11 in plasma processing chamber 10. Plasma processing chamber 10 can facilitate the formation of a processing plasma in process space 12 adjacent substrate 35. The plasma processing system 1 can be configured to process 200 mm substrates, 300 mm substrates, or larger.

In the illustrated embodiment, upper electrode 22 comprises an electrode plate 24 (FIG. 1) with a deposition shield 26 (FIG. 1). In an alternate embodiment, upper assembly 20 can comprise at least one of a cover, a gas injection assembly, and an upper electrode impedance match network. For example, the upper electrode 22 can be coupled to an RF source. In another alternate embodiment, the upper assembly 20 comprises a cover coupled to the upper electrode 22, wherein the upper electrode 22 is maintained at an electrical potential equivalent to that of the plasma processing chamber 10. For example, the plasma processing chamber 10, the upper assembly 20, and the upper electrode 22 can be electrically connected to ground potential.

Plasma processing chamber 10 can, for example, further comprise an optical viewport 16 coupled to the deposition shield 26 of upper electrode 22. Optical viewport 16 can comprise an optical window 17 coupled to the backside of an optical window deposition shield 18, and an optical window flange 19 can be configured to couple optical window 17 to the optical window deposition shield 18. Sealing members, such as O-rings, can be provided between the optical window flange 19 and the optical window 17, between the optical window 17 and the optical window deposition shield 18, and between the optical window deposition shield 18 and the plasma processing chamber 10. Optical viewport 16 can, for example, permit monitoring of optical emission from the processing plasma in process space 12.

Substrate holder 30 can, for example, further comprise a vertical translational device 50 surrounded by a bellows 52 coupled to the substrate holder 30 and the plasma processing chamber 10, and configured to seal the vertical translational device 50 from the reduced pressure atmosphere 11 in plasma processing chamber 10. Additionally, a bellows shield 54 can, for example, be coupled to the substrate holder 30 and configured to protect the bellows 52 from the processing plasma. Substrate holder 10 can, for example, further be coupled to at least one of a focus ring 60, and a shield ring 62. Furthermore, a baffle plate 64 can extend about a periphery of the substrate holder 30.

Substrate 35 can be, for example, transferred into and out of plasma processing chamber 10 through a slot valve (not shown) and chamber feed-through (not shown) via robotic substrate transfer system where it is received by substrate lift pins (not shown) housed within substrate holder 30 and mechanically translated by devices housed therein. Once substrate 35 is received from substrate transfer system, it is lowered to an upper surface of substrate holder 30.

Substrate 35 can be, for example, affixed to the substrate holder 30 via an electrostatic clamping system. Furthermore, substrate holder 30 can, for example, further include a cooling system including a re-circulating coolant flow that receives heat from substrate holder 30 and transfers heat to a heat exchanger system (not shown), or when heating, transfers heat from the heat exchanger system. Moreover, gas can, for example, be delivered to the back-side of substrate 35 via a backside gas system to improve the gas-gap thermal conductance between substrate 35 and substrate holder 30. Such a system can be utilized when temperature control of the substrate is required at elevated or reduced temperatures. In other embodiments, heating elements, such as resistive heating elements, or thermoelectric heaters/coolers can be included.

In the illustrated embodiment, shown in FIG. 1, substrate holder 30 can comprise an electrode through which RF power is coupled to the processing plasma in process space 12. For example, substrate holder 30 can be electrically biased at a RF voltage via the transmission of RF power from a RF generator (not shown) through an impedance match network (not shown) to substrate holder 30. The RF bias can serve to heat electrons to form and maintain plasma. In this configuration, the system can operate as a reactive ion etch (RIE) reactor, wherein the chamber and upper gas injection electrode serve as ground surfaces. A typical frequency for the RF bias can range from 1 MHz to 100 MHz and is preferably 13.56 MHz. RF systems for plasma processing are well known to those skilled in the art.

Alternately, the processing plasma formed in process space 12 can be formed using a parallel-plate, capacitively coupled plasma (CCP) source, an inductively coupled plasma (ICP) source, any combination thereof, and with and without magnet systems. Alternately, the processing plasma in process space 12 can be formed using electron cyclotron resonance (ECR). In yet another embodiment, the processing plasma in process space 12 is formed from the launching of a Helicon wave. In yet another embodiment, the processing plasma in process space 12 is formed from a propagating surface wave.

Figure 2:
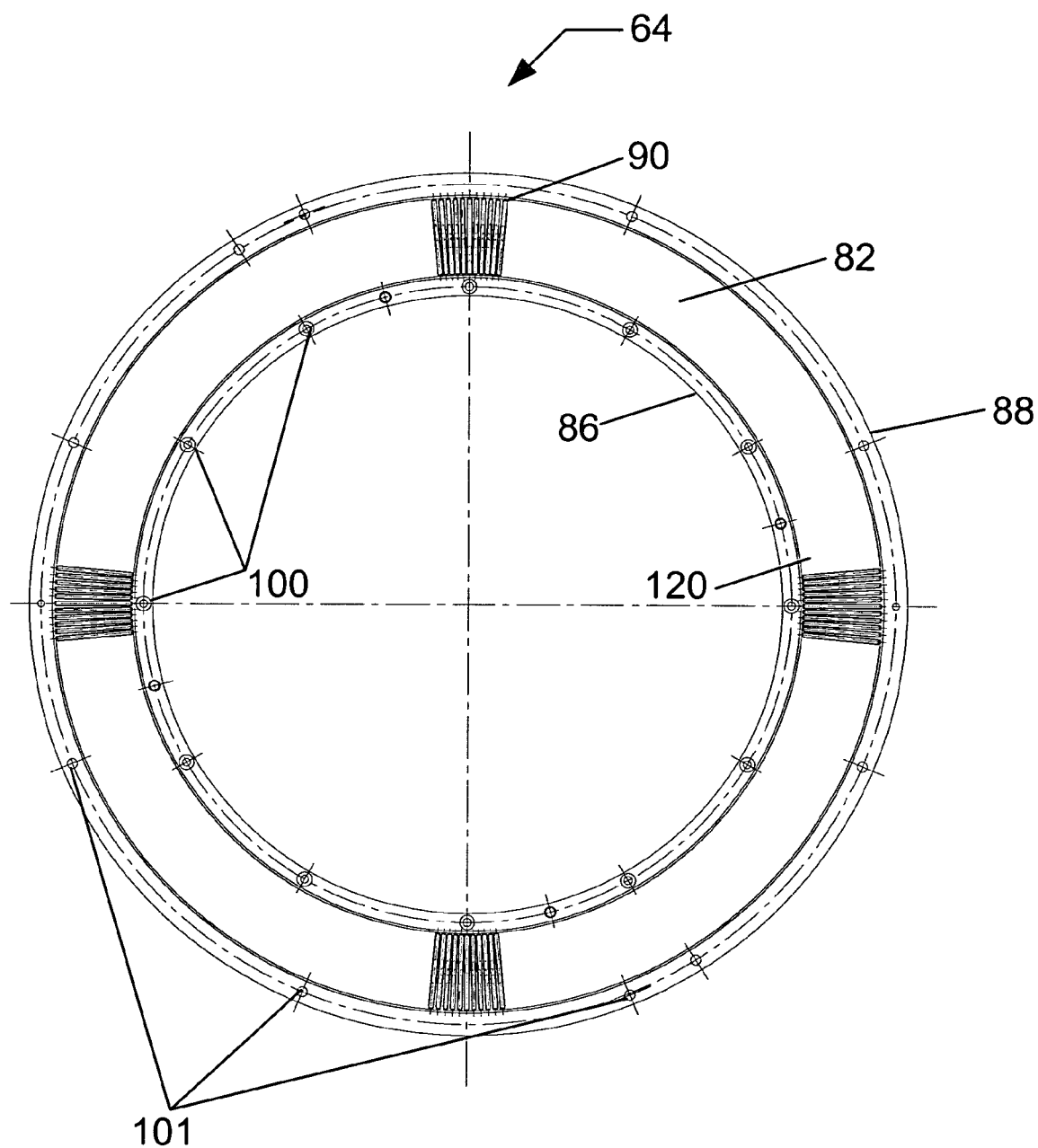
FIG. 2 shows a plan view of a baffle plate for a plasma processing system according to an embodiment of the present invention.
Figure 3:
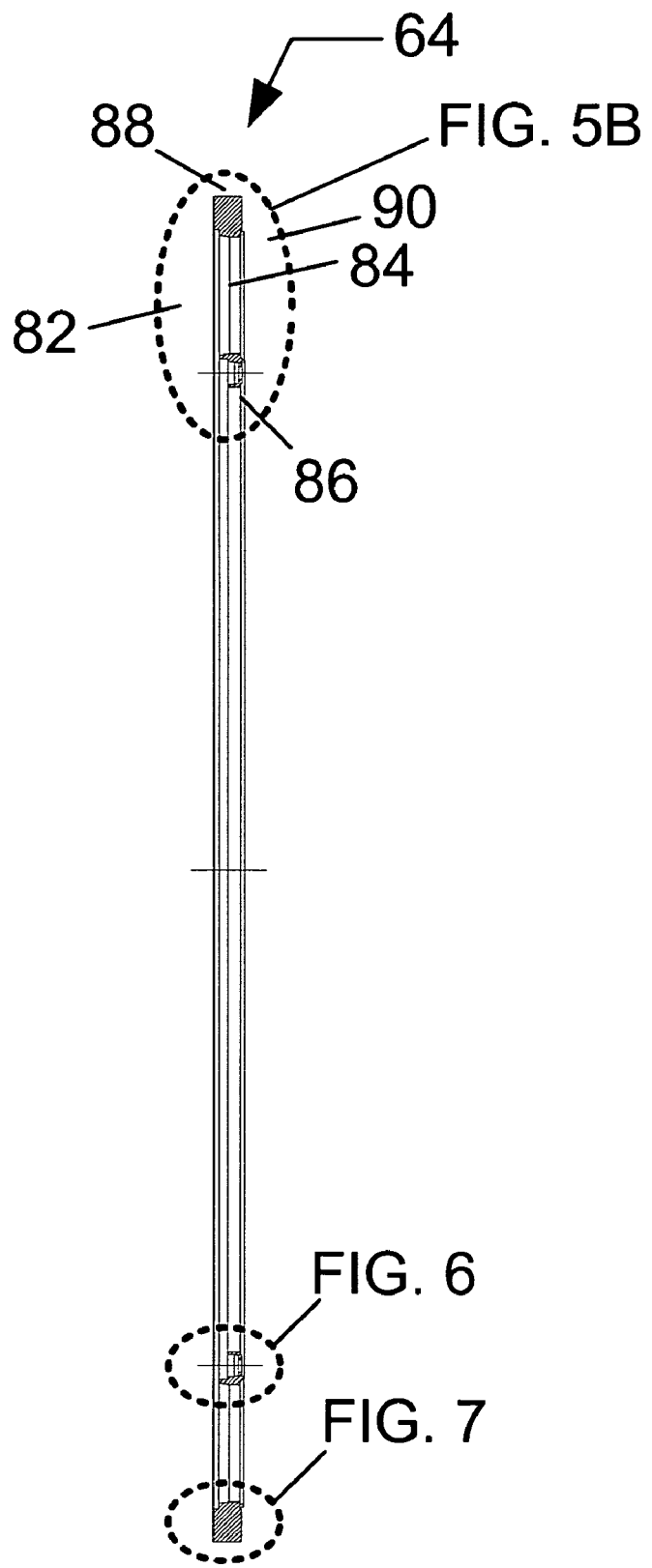
FIG. 3 shows a cross sectional view of a baffle plate for a plasma processing system according to an embodiment of the present invention.

Referring now to an illustrated embodiment of the present invention depicted in FIG. 2 (plan view) and FIG. 3 (cross sectional view), baffle plate 64 can form a ring comprising an upper surface 82, a lower surface 84, an inner radial edge 86, and an outer radial edge 88. The baffle plate 64 can further comprise at least one passageway 90 coupled to the upper surface 82 and to the lower surface 84, and configured to permit the flow of gas therethrough.

Figure 4:
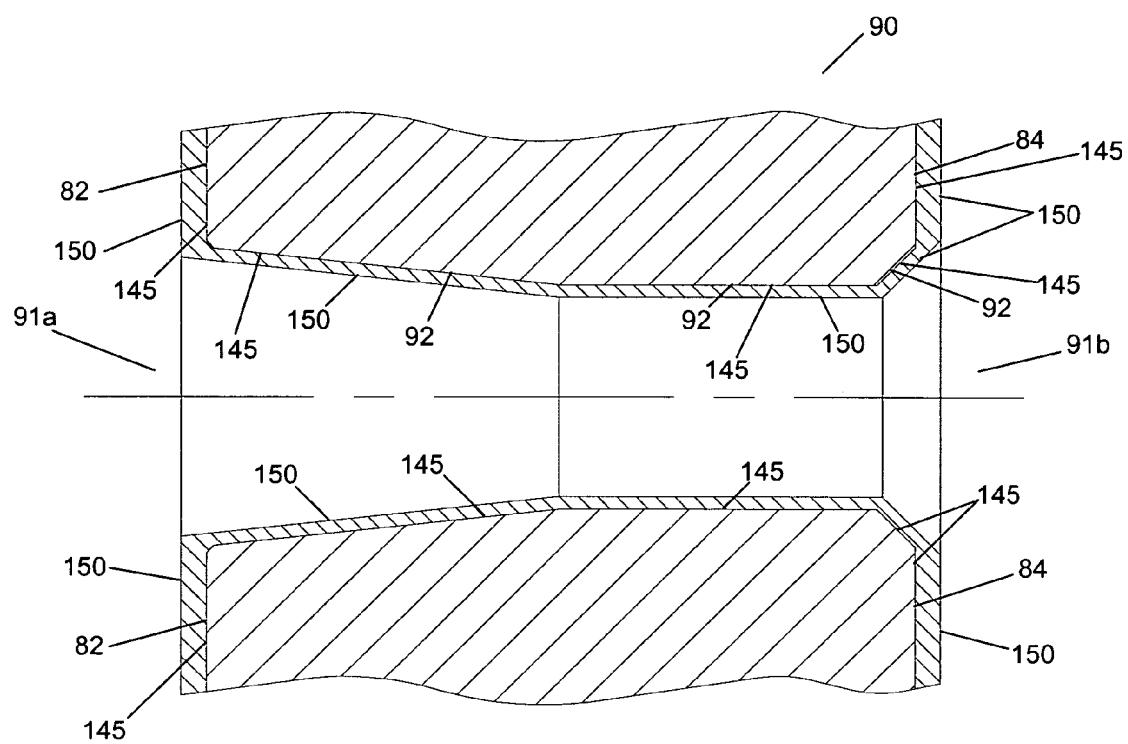
FIG. 4 shows an expanded cross sectional view taken along a minor axis of one passageway formed within a baffle plate for a plasma processing system according to an embodiment of the present invention.

FIG. 4 provides an expanded view of one of the passageways 90, wherein the expanded view provides a transverse cross sectional view taken along a minor axis of the passageway 90. Each passageway 90 comprises an inner passageway surface 92 contiguous with the upper surface 82 and the lower surface 84 of the baffle plate 64. For example, at least one passageway 90 can comprise a length, dictated by the distance between the upper surface 82 and the lower surface 84 proximate each passageway 90, having a dimensional range from 1 to 50 mm. Desirably, the length comprises a dimensional range from 1 to 10 mm, and preferably the length is at least 5 mm.

Figures 5A, 5B, 5C:
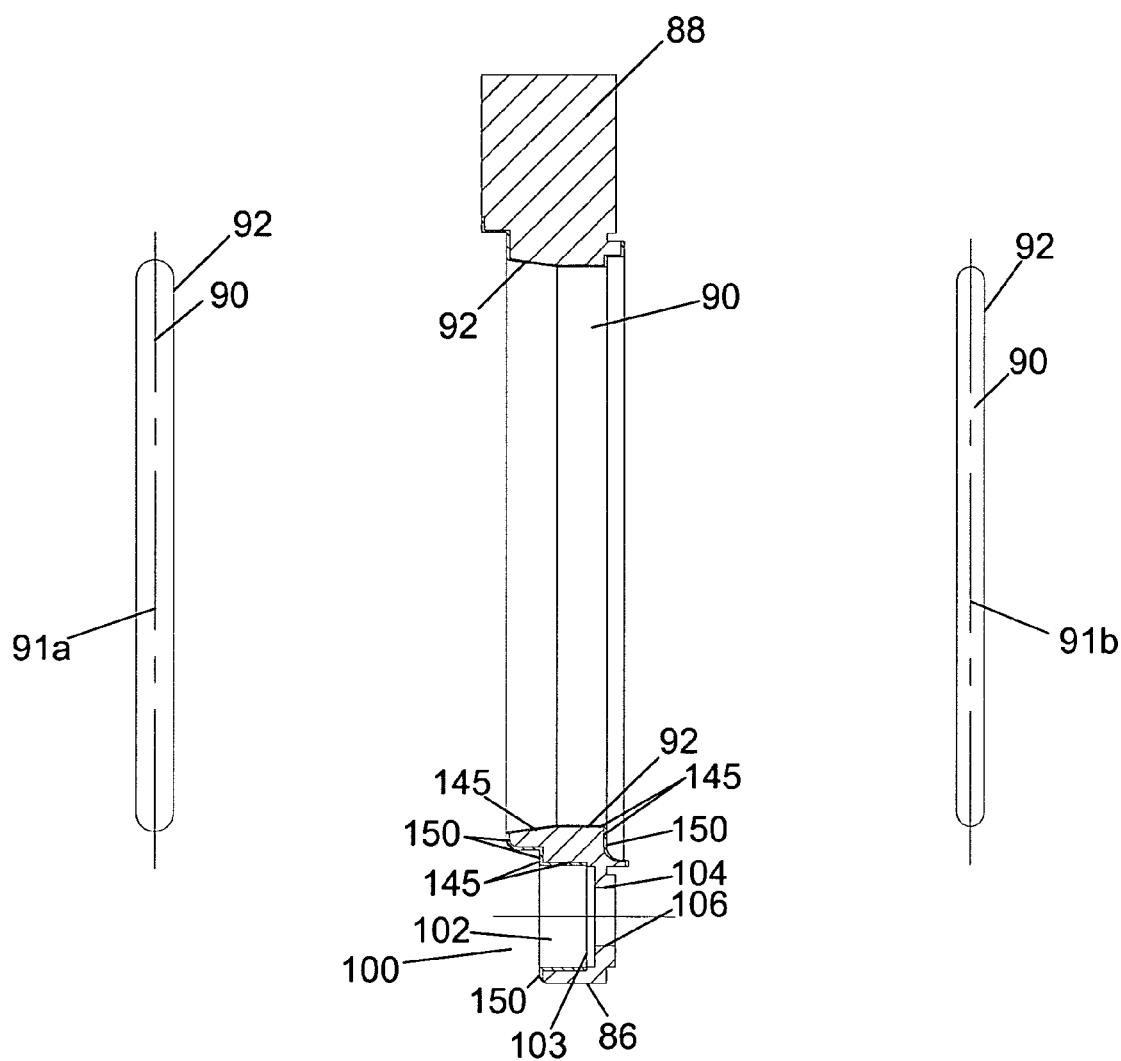
FIG. 5A shows an expanded view of one passageway formed within an upper surface of a baffle plate for a plasma processing system according to an embodiment of the present invention.
FIG. 5B shows an expanded cross sectional view taken along a major axis of one passageway formed within a baffle plate for a plasma processing system according to an embodiment of the present invention.
FIG. 5C shows an expanded view of one passageway formed within a lower surface of a baffle plate for a plasma processing system according to an embodiment of the present invention.

FIGS. 5A, 5B, and 5C provide an exemplary cross-sectional view of passageway 90 at the upper surface 82 of baffle plate 64, an additional expanded cross-sectional view of passageway 90 taken along a major axis of the passageway 90, and an exemplary cross-sectional view of passageway 90 at the lower surface 84 of baffle plate 64, respectively.

In the illustrated embodiment shown in FIG. 1 and FIG. 5B, the at least one passageway 90 can comprise slots aligned in a radial direction. In an alternate embodiment of the present invention, the slots can be aligned in an azimuthal direction. In an alternate embodiment of the present invention, the slots can be slanted and, therefore, aligned partially in a radial direction and an azimuthal direction. In an alternate embodiment, the passageways 90 can comprise a combination of alignment methodologies thereof. Alternately, the passageways can include at least one orifice.

Additionally, referring now to FIG. 5A and FIG. 5B, the cross sectional view of the passageway 90 at the upper surface 82 comprises a cross sectional entrance area 91$a$ that is greater than the respective cross sectional exit area 91$b$ depicted in the cross sectional view of the passageway 90 at the lower surface 84. Alternately, the cross sectional area can be, for example, constant along the length of the passageway from the upper surface 82 to the lower surface 84. Alternately, the cross-sectional exit area 91$b$ of the passageway 90 at the lower surface 84 can, for example, comprise a cross-sectional area greater than the respective cross-sectional entrance area 91$a$ of the passageway 90 at the upper surface 82.

Still referring to FIG. 5B and again to FIG. 2, baffle plate 64 can, for example, further comprise a plurality of fastening receptors 100. Each fastening receptor 100 can be coupled to the upper surface 82 and the lower surface 84, and configured to receive fastening devices (not shown) (such as bolts) to couple baffle plate 64 to substrate holder 30. The fastening receptors 100 can comprise a first entrant cavity 102, a second entrant cavity 103, and an exit through-hole 104. Alternately, second entrant cavity 103 is not required. For example, the number of fastening receptors 100 formed within baffle plate 64 can range from 0 to 100. Desirably, the number of fastening receptors 100 ranges from 5 to 20; and, preferably, the number of fastening receptors 100 equals 12 fastening receptors.

Figure 6:
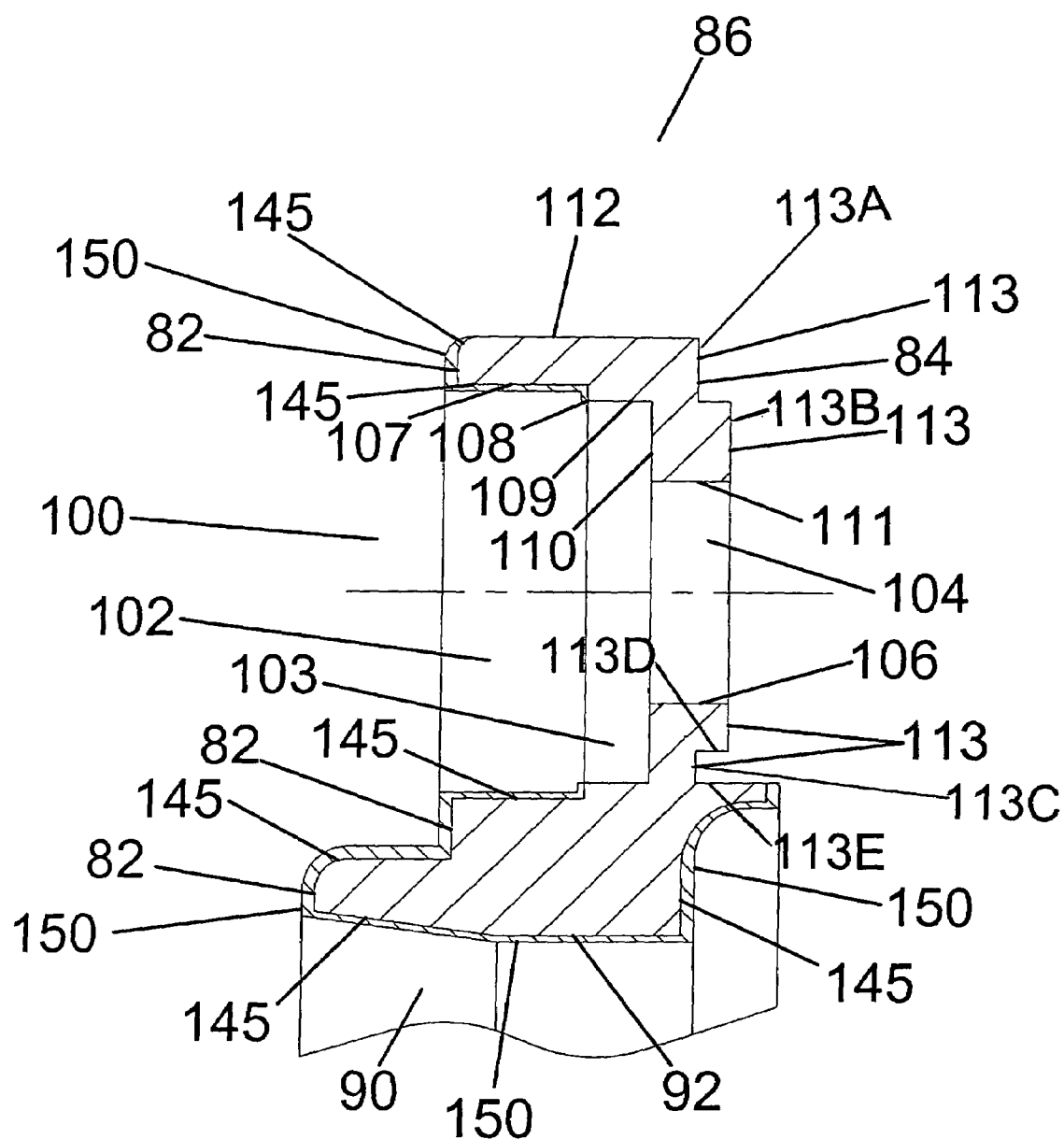
FIG. 6 presents an expanded view of an inner radial edge of a baffle plate for a plasma processing system according to an embodiment of the present invention.

FIG. 6 depicts an expanded cross sectional view of the inner radial edge 86 of baffle plate 64 comprising one of the plurality of fastening receptors 100. The inner radial edge 86 can further comprise an inner edge surface 112 and a plurality of fastener mating surfaces 113. The inner edge surface 112 can be coupled to the upper surface 82 and the lower surface 84 of baffle plate 64. At least one of the fastener mating surfaces 113 can be coupled to and coincident with the lower surface 84 of baffle plate 64 and configured to mate the baffle plate 64 with substrate holder 30. Furthermore, as shown in FIG. 6, the fastening receptor 100 can include an inner receptor surface 106 that can further comprise a first entrant surface 107, a first lip surface 108, a second entrant surface 109, a second lip surface 110, and an exit surface 111. For example, the inner radial edge 86 can comprise a minimum thickness, dictated by a distance between the upper surface 82 and the lower surface 84 proximate the inner radial edge 86, having a dimensional range from 1 to 50 mm. Desirably, the minimum thickness comprises a dimensional range from 1 to 10 mm, and preferably the minimum thickness is at least 2 mm.

In the embodiment of FIG. 6, the fastener mating surfaces 113 include an inner edge mating surface 113A, a protruded mating surface 113B, and a recessed mating surface 113C. A first sidewall 113D couples the protruded mating surface 113B to the recessed mating surface 113C, and a second sidewall 113E couples the recessed mating surface 113C to the exposed surface 145 having a coating 150 thereon.

Figure 7:
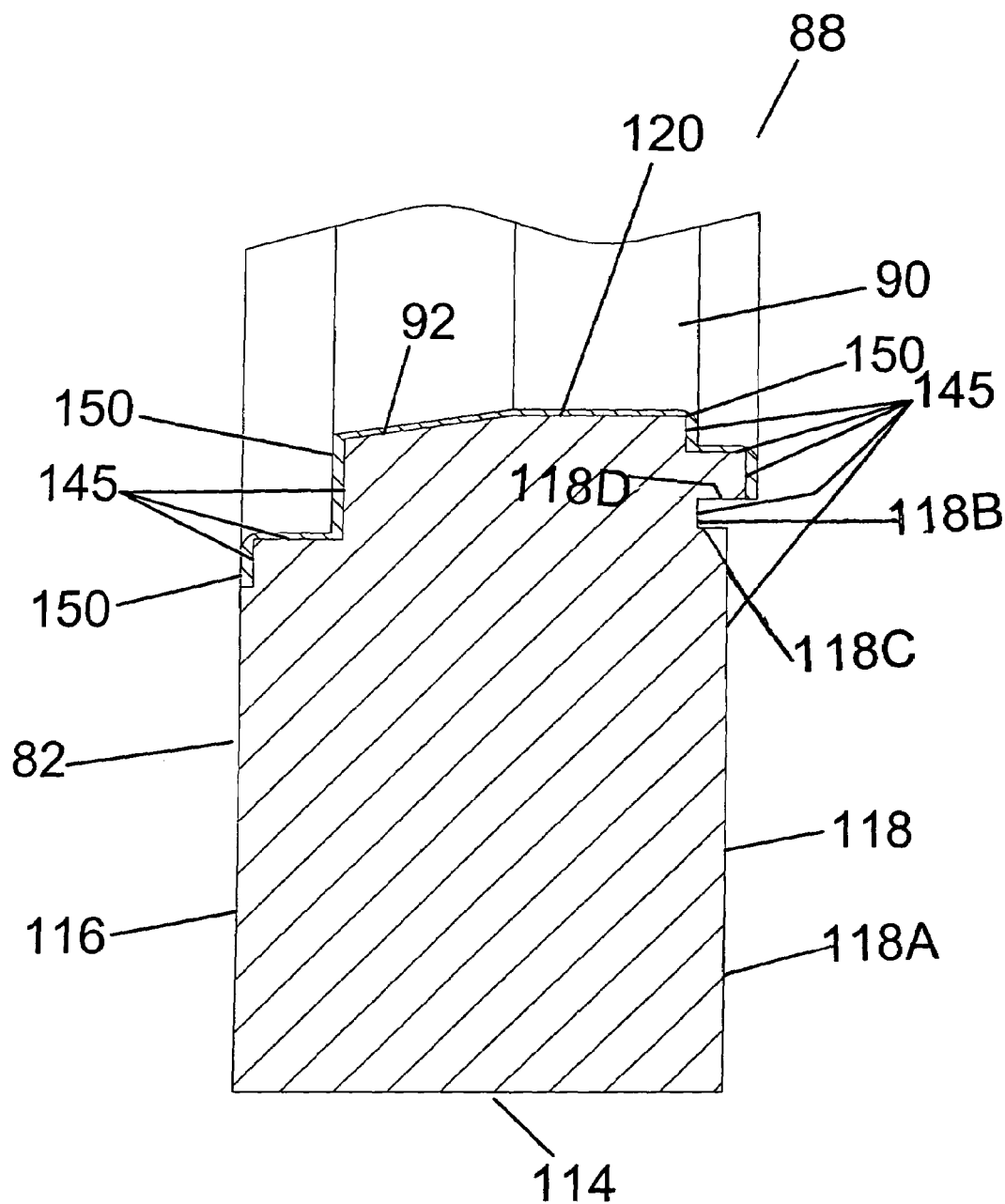
FIG. 7 presents an expanded view of an outer radial edge of a baffle plate for a plasma processing system according to an embodiment of the present invention.

FIG. 7 provides an expanded cross sectional view of the outer radial edge 88 of baffle plate 64. The outer radial edge 88 can further comprise an outer edge surface 114, a first mating surface 116, and a second mating surface 118. The outer edge surface 114 can be coupled to the upper surface 82 and the lower surface 84 of baffle plate 64. The first mating surface 116 can be coupled to and coincident with a portion of the upper surface 82, and configured to mate with plasma processing system 1. The second mating surface 118 can be coupled to and coincident with a portion of the lower surface 84, and configured to mate with plasma processing system 1. For example, first and second mating surfaces can be used to mate baffle plate 64 with at least one of a deposition shield 14 and a plasma processing chamber 10. Additionally, for example, the outer radial edge 88 can comprise a thickness, dictated by the distance between the first mating surface 116 and the second mating surface 118 proximate the outer radial edge 88, having a dimensional range from 1 to 50 mm. Desirably, the thickness comprises a dimensional range from 1 to 10 mm, and preferably the thickness is at least 7 mm.

Additionally, as shown in FIG. 2, baffle plate 64 can, for example, further comprise a plurality of mounting through-holes 101. Each mounting through-hole 101 can be coupled to the upper surface 82 and the lower surface 84, and configured to receive fastening devices (not shown) (such as bolts) to couple baffle plate 64 to at least one of the plasma processing chamber 10 and the deposition shield 26 of the upper electrode 22. For example, the number of mounting through-holes 101 formed within baffle plate 64 can range from 0 to 100. Desirably, the number of mounting through-holes 101 ranges from 5 to 20; and, preferably, the number of mounting through-holes 101 is at least 10.

In the embodiment of FIG. 7, the second mating surface 118 includes an outer edge mating surface 118A and a recessed mating surface 118B. A first sidewall 118C couples the outer edge mating surface 118A to the recessed mating surface 118B, and a second sidewall 118D couples the recessed mating surface 118B to exposed surface 145 having coating 150 thereon.

Referring now to FIGS. 2 through 7, the baffle plate 64 further comprises a protective barrier 150 formed on a plurality of exposed surfaces 145 of the baffle plate 64. In an embodiment of the present invention, the exposed surfaces 145 can comprise the upper surface 82 of baffle plate 64 excluding the first mating surface 116; the lower surface 84 of baffle plate 64 excluding the plurality of fastener mating surfaces 113 and the second mating surface 118; and the inner passageway surface 92 contiguous with the upper surface 82 and the lower surface 84. Additionally, the exposed surfaces 145 can comprise the first entrant surface 107 of each of the plurality of fastening receptors 100; and the first lip surface 108 of each of the plurality of fastening receptors 100. Alternately, the exposed surfaces comprise all surfaces on the baffle plate 64.

In an embodiment of the present invention, the protective barrier 150 can comprise a compound including an oxide of aluminum such as $Al_2O_3$. In another embodiment of the present invention, the protective barrier 150 can comprise a mixture of $Al_2O_3$ and $Y_2O_3$. In another embodiment of the present invention, the protective barrier 150 can comprise at least one of a III-column element (column III of periodic table) and a Lanthanon element. In another embodiment of the present invention, the III-column element can comprise at least one of Yttrium, Scandium, and Lanthanum. In another embodiment of the present invention, the Lanthanon element can comprise at least one of Cerium, Dysprosium, and Europium. In another embodiment of the present invention, the compound forming protective barrier 150 can comprise at least one of Yttria ($Y_2O_3$), $Sc_2O_3$, $Sc_2F_3$, $YF_3$, $La_2O_3$, $CeO_2$, $Eu_2O_3$, and $Dy_2O_3$.

In an embodiment of the present invention, the protective barrier 150 formed on baffle plate 64 comprises a thermal sprayed coating having a minimum thickness, wherein the minimum thickness can be allowed to vary across the plurality of exposed surfaces 145. In other words, the specified thickness can be variable across the exposed surfaces 145. For example, the minimum thickness can be constant over a first portion of the exposed surfaces 145 and variable over a second portion of the exposed surfaces 145. For example, a variable thickness can occur on a curved surface, on a corner, or in a hole. The minimum thickness ranges from 0 micron to 550 micron. Desirably, the minimum thickness ranges from 50 micron to 250 micron; and, preferably, the minimum thickness ranges from 150 micron to 250 micron.

Figure 8:
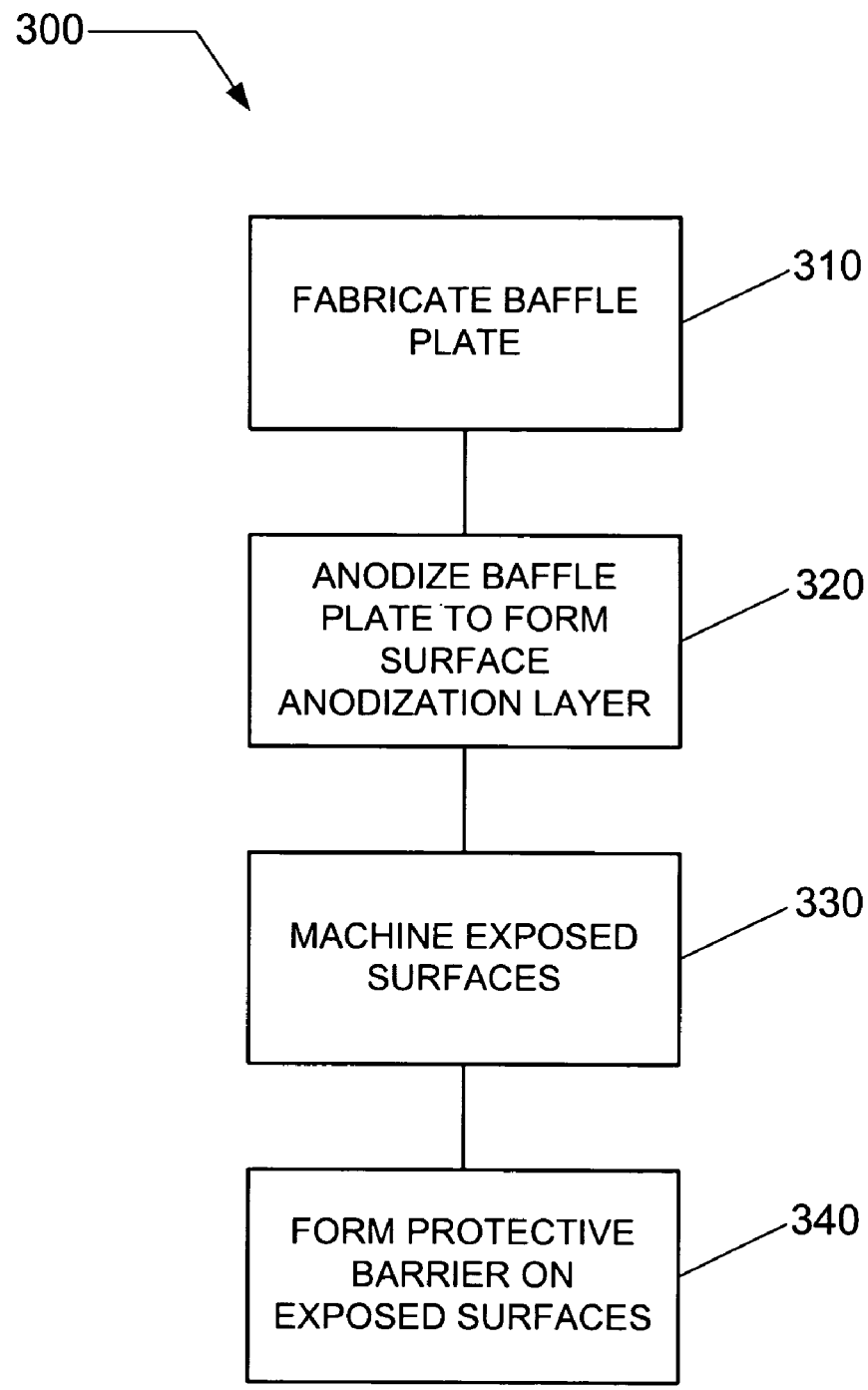
FIG. 8 presents a method of producing a baffle plate for a plasma processing system according to an embodiment of the present invention.

FIG. 8 presents a method of producing the baffle plate 64 in the plasma processing system described in FIG. 1 according to an embodiment of the present invention. A flow diagram 300 begins in 310 with fabricating the baffle plate 64 (e.g., a baffle plate having the characteristics of the plate described with reference to FIGS. 2-7). Fabricating the baffle plate can comprise at least one of machining, casting, polishing, forging, and grinding. For example, each of the elements described above can be machined according to specifications set forth on a mechanical drawing, using conventional techniques including a mill, a lathe, etc. The techniques for machining a component using, for example, a mill or a lathe, are well known to those skilled in the art of machining. The baffle plate can, for example, be fabricated from aluminum.

In 320, the baffle plate is anodized to form a surface anodization layer. For example, when fabricating the baffle plate from aluminum, the surface anodization layer comprises aluminum oxide ($Al_2O_3$). Methods of anodizing aluminum components are well known to those skilled in the art of surface anodization.

In 330, the surface anodization layer is removed from the exposed surfaces 145 using standard machining techniques. During the same machining step, or during a separate machining step, other surfaces (e.g., the first mating surface of the upper surface, the second mating surface of the lower surface, and the plurality of fastener mating surfaces of the lower surface) may also be machined (e.g., to produce a flat or bare surface that provides at least one of a good mechanical or electrical contact at the machined surface).

In 340, the protective barrier 150 is formed on the exposed surfaces 145. A protective barrier 150 comprising, for example Yttria, can be formed using (thermal) spray coating techniques that are well known to those skilled in the art of ceramic spray coatings. In an alternate embodiment, forming the protective barrier can further comprise polishing the thermal spray coating. For example, polishing the thermal spray coating can comprise the application of sand paper to the sprayed surfaces.

Figure 9:
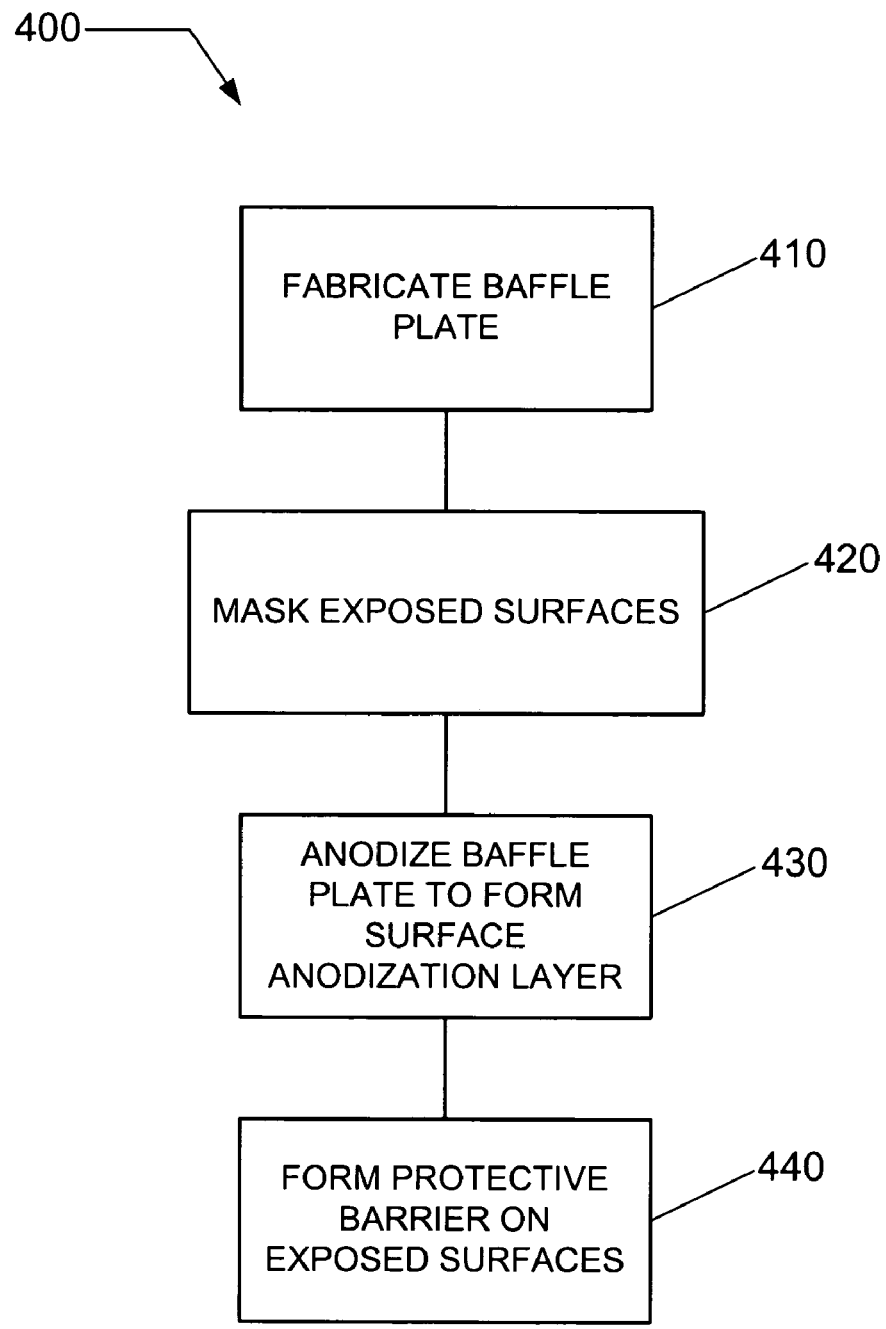
FIG. 9 presents a method of producing a baffle plate for a plasma processing system according to another embodiment of the present invention.

FIG. 9 presents a method of producing the baffle plate in the plasma processing system described in FIG. 1 according to another embodiment of the present invention. A flow diagram 400 begins in 410 with fabricating the baffle plate 64 (e.g., a baffle plate having the characteristics of the plate described with reference to FIGS. 2-7). Fabricating the baffle plate can comprise at least one of machining, casting, polishing, forging, and grinding. For example, each of the elements described above can be machined according to specifications set forth on a mechanical drawing, using conventional techniques including a mill, a lathe, etc. The techniques for machining a component using, for example, a mill or a lathe, are well known to those skilled in the art of machining. The baffle plate can, for example, be fabricated from aluminum.

In 420, exposed surfaces 145 are masked to prevent the formation of a surface anodization layer thereon. Techniques for surface masking and unmasking are well known to those skilled in the art of surface coatings and surface anodization. During the same masking step, or during a separate masking step, other surfaces (e.g., the first mating surface of the upper surface, the second mating surface of the lower surface, and the plurality of fastener mating surfaces of the lower surface) may also be masked (e.g., to maintain a flat or bare surface that provides at least one of a good mechanical or electrical contact at the machined surface).

In 430, the baffle plate is anodized to form a surface anodization layer on the remaining unmasked surfaces. For example, when fabricating the baffle plate from aluminum, the surface anodization layer can comprise aluminum oxide ($Al_2O_3$). Methods of anodizing aluminum components are well known to those skilled in the art of surface anodization.

In 440, the protective barrier 150 is formed on the exposed surfaces. A protective barrier comprising, for example Yttria, can be formed using (thermal) spray coating techniques that are well known to those skilled in the art of ceramic spray coatings. In an alternate embodiment, forming the protective barrier can further comprise polishing the thermal spray coating. For example, polishing the thermal spray coating can comprise the application of sand paper to the sprayed surfaces.

Figure 10:
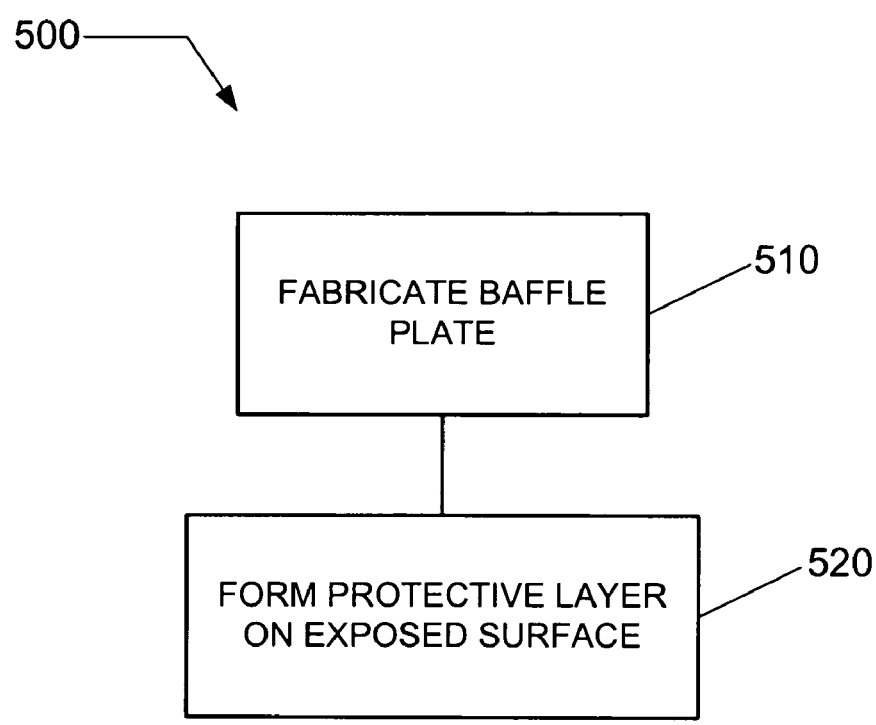
FIG. 10 presents a method of producing a baffle plate for a plasma processing system according to another embodiment of the present invention.

FIG. 10 presents a method of producing the baffle plate in the plasma processing system described in FIG. 1 according to another embodiment of the present invention. A flow diagram 500 begins in 510 with fabricating the baffle plate 64 (e.g., a baffle plate having the characteristics of the plate described with reference to FIGS. 2-7). Fabricating the baffle plate can comprise at least one of machining, casting, polishing, forging, and grinding. For example, each of the elements described above can be machined according to specifications set forth on a mechanical drawing, using conventional techniques including a mill, a lathe, etc. The techniques for machining a component using, for example, a mill or a lathe, are well known to those skilled in the art of machining. The baffle plate can, for example, be fabricated from aluminum.

In 520, a protective barrier 150 is formed on exposed surfaces 145 of the baffle plate 64. A protective barrier comprising, for example Yttria, can be formed using (thermal) spray coating techniques that are well known to those skilled in the art of ceramic spray coatings. In an alternate embodiment, forming the protective barrier can further comprise polishing the thermal spray coating. For example, polishing the thermal spray coating can comprise the application of sand paper to the sprayed surfaces.

The processes of forming a protective barrier 150 on the exposed surfaces 145, described with reference to FIGS. 8-10 can be modified to utilize a combination of machining and masking. In such a modified process, at least one exposed surface is masked to prevent formation of the anodization layer thereon while other exposed surfaces are anodized. The exposed surfaces that are unmasked are then machined, and the exposed surfaces that were masked are unmasked. The protective barrier 150 can then be formed on all the exposed surfaces. As described above, additional surfaces that are not exposed surfaces may also be machined during the method (e.g., in order to provide a better mechanical or electrical contact than would be formed with the anodization layer thereon.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. An improved baffle plate in a plasma processing system comprising:
a ring comprising an upper surface, a lower surface, an inner radial edge coupled to said upper surface and said lower surface, an outer radial edge coupled to said upper surface and said lower surface, and at least one passageway coupled to said upper surface and to said lower surface and configured to permit the flow of a gas therethrough,
wherein said upper surface comprises a first mating surface proximate said outer radial edge, said lower surface comprises a second mating surface proximate said outer radial edge and a plurality of fastener mating surfaces proximate said inner radial edge, and each of said at least one passageway comprises an internal passageway surface,
wherein said second mating surface comprises:
an outer edge mating surface extending radially inward from said outer radial edge; and
a recessed mating surface recessed from the outer edge mating surface, and wherein said ring further comprises at least one of a plurality of fastening receptors and a plurality of mounting through-holes coupled to said upper surface and said lower surface of said baffle plate and configured to receive fastening devices in order to couple said baffle plate to said plasma processing system.

2. The improved baffle plate as recited in claim 1, wherein at least one of said plurality of fastening receptors comprises an entrant cavity, an exit through-hole, and an inner receptor surface.

3. The improved baffle plate as recited in claim 2, wherein said inner receptor surface of at least one of said plurality of fastening receptors comprises a first entrant surface, a first lip surface, a second entrant surface, a second lip surface, and an exit surface.

4. The improved baffle plate as recited in claim 3, wherein said first entrant surface and said first lip surface include a protective barrier thereon.

5. The improved baffle plate as recited in claim 4, wherein said second entrant surface, said second lip surface and said exit surface do not include said protective barrier.

6. The improved baffle plate as recited in claim 4, wherein said protective barrier is a coating comprising Yttria.

7. The improved baffle plate as recited in claim 6, wherein said plurality of fastening receptors are provided along said inner radial edge, the baffle plate further comprising said plurality of mounting through-holes, which are mounted along said outer radial edge of the baffle plate.

8. The improved baffle plate as recited in claim 1, wherein said at least one passageway comprises a slot.

9. The improved baffle plate as recited in claim 8, wherein said slot comprises an entrance area opening on said upper surface and an exit area opening on said lower surface, wherein said entrance area is larger than said exit area.

10. The improved baffle plate of claim 9, wherein said internal passageway surface extends from said upper surface to said lower surface, said baffle plate further comprising a protective barrier provided on said internal passageway surface.

11. The improved baffle plate of claim 10, wherein said protective barrier comprises a contiguous coating extending from said upper surface to said lower surface, said contiguous coating comprising Yttria.

12. The improved baffle plate of claim 11, wherein said exit area comprises a tapered surface extending from said lower surface to said internal passageway surface.

13. The improved baffle plate of claim 1, wherein said plurality of fastener mating surfaces comprises a recessed mating surface positioned radially outward from said fastening receptors.

14. The improved baffle plate of claim 1, wherein said plurality of fastener mating surfaces comprises:
 an inner edge mating surface extending radially outward from said inner radial edge;
 a protruded mating surface axially protruded from said inner edge mating surface and extending radially outward from the inner edge mating surface; and
 a recessed mating surface recessed from said protruded mating surface.

15. The improved baffle plate of claim 14, further comprising:
 a first sidewall extending in an axial direction from said protruded mating surface to said recessed mating surface; and
 a second sidewall opposing said first sidewall and extending in an axial direction from said recessed mating surface to an exposed surface of the lower surface of the baffle plate.

16. The improved baffle plate of claim 15, wherein said exposed surface includes thereon a coating which comprises Yttria, and said recessed mating surface does not include said coating thereon.

17. The improved baffle plate of claim 16, wherein said recessed surface does not include an anodized coating thereon.

18. The improved baffle plate of claim 1, further comprising:
 a first sidewall extending in an axial direction from said outer edge mating surface to said recessed mating surface; and
 a second sidewall opposing said first sidewall and extending in an axial direction from said recessed mating surface to an exposed surface of the lower surface of the baffle plate, wherein the exposed surface is protruded from the outer edge mating surface.

19. The improved baffle plate of claim 18, wherein said exposed surface includes thereon a coating which comprises Yttria, and said recessed mating surface does not include said coating thereon.

20. The improved baffle plate of claim 19, wherein said recessed surface does not include an anodized coating thereon.

21. The improved baffle plate of claim 1, wherein said second mating surface comprises a recessed surface which extends partially but not completely through said baffle plate, said recessed surface positioned radially inward of said mounting through holes.

* * * * *